(12) United States Patent
Mirhaj et al.

(10) Patent No.: US 11,631,455 B2
(45) Date of Patent: Apr. 18, 2023

(54) COMPUTE-IN-MEMORY BITCELL WITH CAPACITIVELY-COUPLED WRITE OPERATION

(71) Applicant: QUALCOMM Incorporated, San Diego, CA (US)

(72) Inventors: Seyed Arash Mirhaj, Poway, CA (US); Xiaonan Chen, San Diego, CA (US); Ankit Srivastava, San Diego, CA (US); Sameer Wadhwa, San Diego, CA (US); Zhongze Wang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/152,564

(22) Filed: Jan. 19, 2021

(65) Prior Publication Data
US 2022/0230679 A1    Jul. 21, 2022

(51) Int. Cl.
*G11C 11/419* (2006.01)
*G06F 7/544* (2006.01)

(52) U.S. Cl.
CPC .......... *G11C 11/419* (2013.01); *G06F 7/5443* (2013.01)

(58) Field of Classification Search
CPC .......................... G11C 11/419; G06F 7/5443
See application file for complete search history.

(56) References Cited

U.S. PATENT DOCUMENTS

| 8,166,218 | B2 | 4/2012 | Rajamani |
| 9,722,828 | B2 * | 8/2017 | Sun ................... H04L 25/03006 |
| 10,825,510 | B2 | 11/2020 | Jaiswal et al. |
| 11,538,509 | B2 | 12/2022 | Mirhaj et al. |
| 2014/0269010 | A1 | 9/2014 | Dally |
| 2019/0042199 | A1 | 2/2019 | Sumbul et al. |
| 2019/0080231 | A1 | 3/2019 | Nestler et al. |
| 2019/0102359 | A1 | 4/2019 | Knag et al. |
| 2020/0126620 | A1 | 4/2020 | Makosiej |
| 2020/0233923 | A1 | 7/2020 | Knag et al. |
| 2020/0327401 | A1 | 10/2020 | Bates et al. |
| 2021/0005230 | A1 | 1/2021 | Wang et al. |
| 2021/0193669 | A1 * | 6/2021 | Ahmed ............... H01L 27/1104 |
| 2021/0271597 | A1 | 9/2021 | Verma et al. |
| 2021/0327474 | A1 * | 10/2021 | Seok .................... G11C 11/412 |

FOREIGN PATENT DOCUMENTS

| CN | 113255904 A * | 8/2021 |
| CN | 113255904 A | 8/2021 |

(Continued)

OTHER PUBLICATIONS

US 11,430,493 B1, 08/2022, Mirhaj (withdrawn)

(Continued)

*Primary Examiner* — Ajay Ojha
(74) *Attorney, Agent, or Firm* — Haynes and Boone, LLP

(57) ABSTRACT

A compute-in-memory bitcell is provided that includes a pair of cross-coupled inverters for storing a stored bit. The compute-in-memory bitcell includes a logic gate for multiplying the stored bit with an input vector bit. An output node for the logic gate connects to a second plate of a capacitor. A first plate of the capacitor connects to a read bit line. A write driver controls a power supply voltage to the cross-coupled inverters, the first switch, and the second switch to capacitively write the stored bit to the pair of cross-coupled inverters.

29 Claims, 8 Drawing Sheets

(56) References Cited

FOREIGN PATENT DOCUMENTS

| | | | |
|---|---|---|---|
| GB | 2583121 | A | 10/2020 |
| WO | 2020139895 | A1 | 7/2020 |
| WO | 2021002990 | A1 | 1/2021 |

OTHER PUBLICATIONS

Jiang Z., et al., "C3SRAM: In-Memory-Computing SRAM Macro Based on Capacitive-Coupling Computing", IEEE Solid-State Circuits Letters, vol. 2, No. 9, Sep. 2019, pp. 131-134.

International Search Report and Written Opinion—PCT/US2022/011345—ISA/EPO—dated Apr. 14, 2022.

Naresh, B., et al., "A Novel 8T SRAM with Improved Cell Density", Analog Integrated Circuits and Signal Processing, Springer New York LLC, US, vol. 98, No. 2, Aug. 31, 2018 (Aug. 31, 2018), XP036693791, pp. 357-366, ISSN 0925-1030, DOI: 10.1007/S10470-018-1309-Z [retrieved on Aug. 31, 2018] 2.2 Proposed 8T SRAM Cell, p. 358, Figure 2.

Valavi, H., et al., "A 64-Tile 2.4-Mb In-Memory-Computing CNN Accelerator Employing Charge-Domain Compute", IEEE Journal of Solid-State Circuits, IEEE, USA, vol. 54, No. 6, Jun. 1, 2019 (Jun. 1, 2019), XP011726793, pp. 1789-1799, ISSN: 0018-9200, DOI: 10.1109/JSSC.2019.2899730 [retrieved on May 23, 2019] Section 3) Multiplying Bit-Cell, p. 1791-p. 1792, Figures 5, 6.

Jia H., et al., "A Programmable Heterogeneours Microprocessor Based on Bit-Scalable in-Memory Computing", IEEE Journal of Solid-State Circuits, Aug. 7, pp. 1-13.

\* cited by examiner

COMPUTE-IN-MEMORY BITCELL WITH CAPACITIVELY-COUPLED WRITE OPERATION

TECHNICAL FIELD

This application relates to compute-in-memories, and more particularly to a compute-in-memory bitcell with a capacitively-coupled write operation.

BACKGROUND

Computer processing of data typically uses a Von Neumann architecture in which the data is retrieved from a memory to be processed in an arithmetic and logic unit. In computation-intensive applications such as machine learning, the data flow from and to the memory becomes a bottleneck for processing speed. To address this data-movement bottleneck, compute-in-memory architectures have been developed in which the data processing hardware is distributed across the bitcells.

A particularly advantageous compute-in-memory bitcell includes a pair of cross-coupled inverters for storing a filter weight bit on a filter weight bit node and a complement filter weight bit on a complement filter weight bit node. The filter weight bit node couples to an output node through a first switch. Similarly, the complement filter weight bit node couples to the output node through a second switch. An input vector bit controls the two switches in a complementary fashion during an evaluation phase. The output node couples to a read bit line through a capacitor. A resulting charge on the capacitor represents a binary multiplication of the stored filter weight bit and the input vector bit. Despite its advantages, such a compute-in-memory bitcell architecture suffers from issues with regard to enabling a write operation of the filter weight bit to the compute-in-memory bitcell. For example, it is conventional to include a reset transistor that couples between the output node and ground so that a binary zero may be passed from ground through the reset transistor and a closed one of the two switches to write the filter weight bit into the bitcell. The reset transistor lowers density.

SUMMARY

A compute-in-memory bitcell is provided that includes: a pair of cross-coupled inverters having a bit node and a complement bit node; an output node; a read bit line; a capacitor coupled between the read bit line and the output node; a first switch coupled between the bit node and the output node; and a second switch coupled between the complement bit output node and the output node, the first switch and the second switch being the only switches coupled to the output node.

In addition, a method for a write operation to a bitcell is provided that includes: reducing a power supply voltage from a default value for a pair of cross-coupled inverters driving a bit node and a complement bit node; while the power supply voltage is reduced from the default value, closing a first switch coupled between the bit node and an output node and closing a second switch coupled between the complement bit node and the output node; selectively opening either the first switch or the second switch responsive to a binary value of a bit to be written to the bitcell to place the first switch and the second switch into a complementary switching state; and restoring the power supply voltage to the default value to complete the write operation.

Moreover, a method for a write operation to a bitcell is provided that includes: discharging a power supply voltage to ground from a default value for a pair of cross-coupled inverters driving a bit node and a complement bit node; while the power supply voltage is discharged, closing a first switch coupled between the bit node and an output node and closing a second switch coupled between the complement bit node and the output node; selectively opening either the first switch or the second switch responsive to a binary value of a bit to be written to the bitcell to place the first switch and the second switch into a complementary switching state; and during the complementary switching state, restoring the power supply voltage to the default value to complete the write operation.

Finally, a memory is provided that includes: a pair of cross-coupled inverters having a bit node and a complement bit node; an output node; a read bit line; a capacitor coupled between the read bit line and the output node; a first switch coupled between the bit node and the output node; and a second switch coupled between the complement bit output node and the output node; and a write driver configured to drive the first switch and the second switch into a complementary switching state during a write operation to capacitively couple a voltage from the read bit line to a node selected from the bit node and the complement bit node responsive to a binary value to be written to the cross-coupled inverters.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figure.

DETAILED DESCRIPTION

Figure 1A:
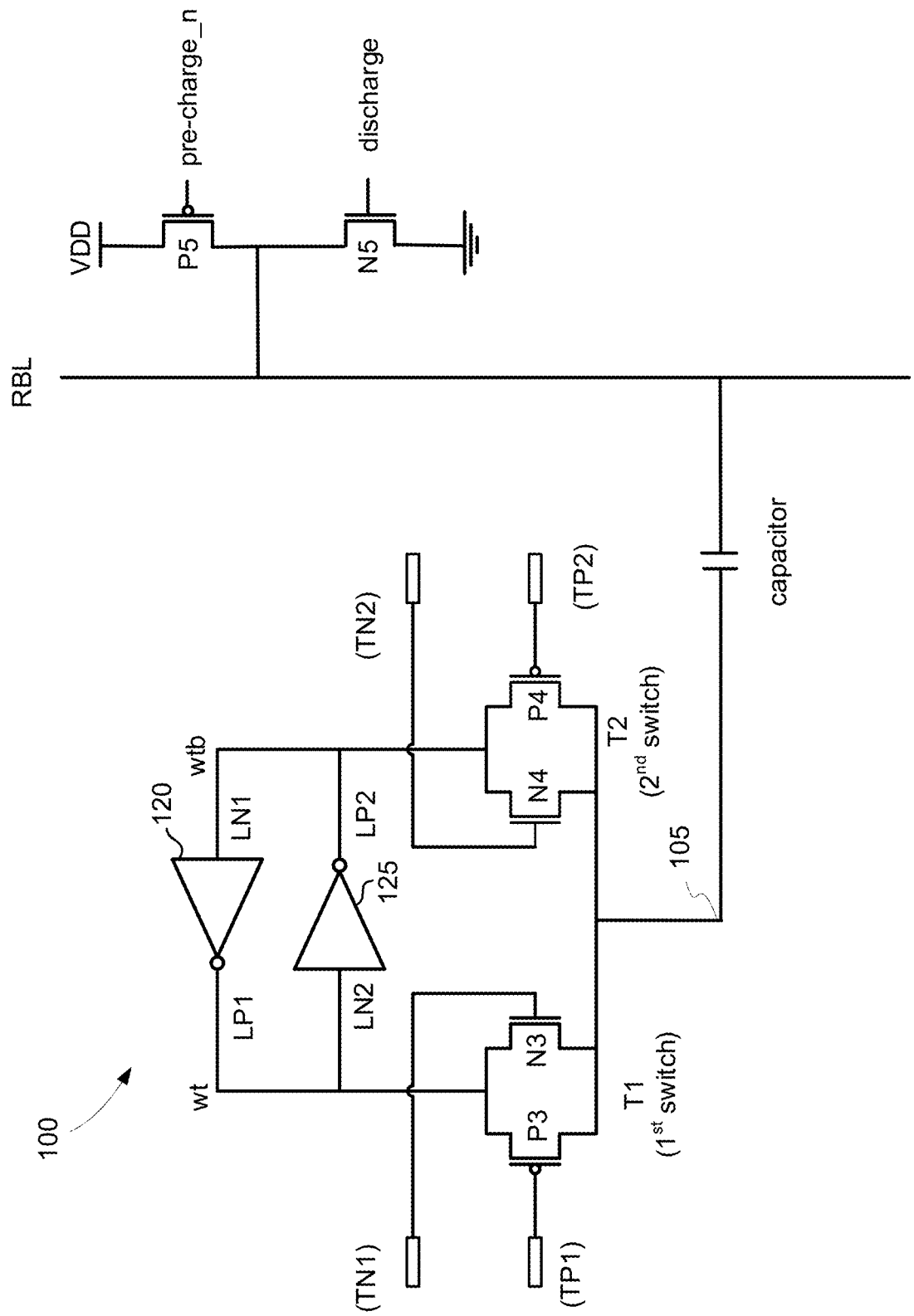
FIG. 1A is a circuit diagram of a compute-in-memory bitcell including a pair of transmission gates in accordance with an aspect of the disclosure.

In deep learning and other machine learning applications, a convolutional layer is a fundamental building block. A convolutional layer includes a collection of nodes for the multiplication of filter weights with an input vector from a previous layer (or from input data such as an image being analyzed). The nodes may also be designated as neurons. To increase the processing speed, the nodes are implemented using compute-in-memory bitcells. A compute-in-memory bitcell as disclosed herein not only stores a filter weight but also includes a logic gate to perform the multiplication of the stored binary filter weight with the corresponding input bit. An example compute-in-memory (CiM) bitcell 100 is shown in FIG. 1A. The logic gate may be formed using a first switch such as a first transmission gate T1 and a second switch such as a transmission gate T2. During an evaluation mode or phase, the first and second switches are controlled by the input bit. A pair of cross-coupled inverters 120 and 125 stores the filter weight bit on a filter weight bit node wt. Similarly, the pair of cross-coupled inverters stores a complement filter weight bit (the complement of the filter weight bit) on a complement filter weight bit node wtb. The first switch couples between the filter weight bit node wt and an output node 105. Similarly, the second switch couples between the complement filter weight bit node wtb and the output node 105. A capacitor couples between the output node 105 and a read bit line (RBL).

Figure 1B:
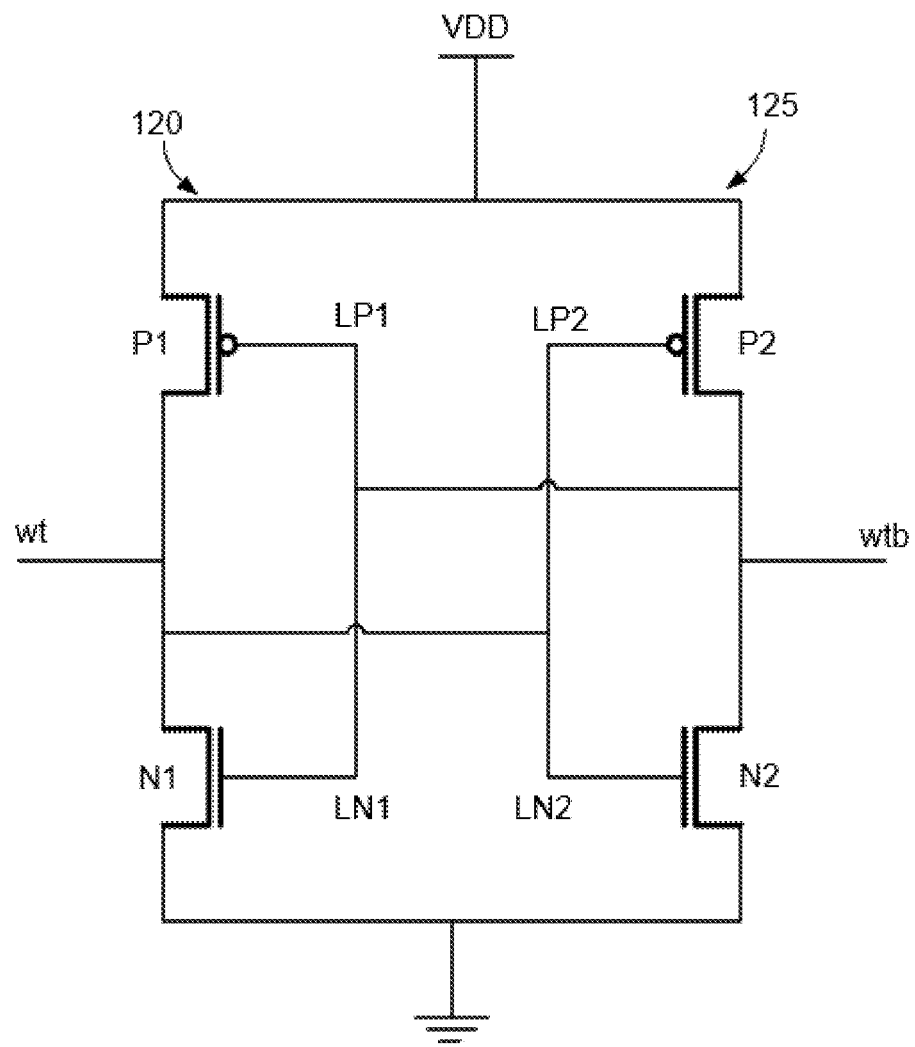
FIG. 1B illustrates the transistor forming the cross-coupled inverters in the compute-in-memory bitcell of FIG. 1A.

Although the first and second switches are formed by transmission gates T1 and T2, respectively, it will be appreciated that other types of switches such as switch transistors may replace the transmission gates T1 and T2 in alternative implementations. Inverters 120 and 125 are shown in more detail in FIG. 1B. Inverter 120 is formed by a PMOS transistor P1 and an NMOS transistor N1. The source of transistor P1 connects to a power supply node for a power supply voltage VDD whereas a drain of transistor P1 connects to drain of transistor N1 that in turn has its source connected to ground. The drains of transistors P1 and N1 form the filter weight bit node wt. Inverter 125 is analogous as inverter 125 is formed by a PMOS transistor P2 and an NMOS transistor N2. The source of transistor P2 connects to the power supply node whereas a drain of transistor P2 connects to drain of transistor N2 that in turn has its source connected to ground. The drains of transistors P2 and N2 form the complement filter weight bit node wtb. To complete the cross-coupling of inverters 120 and 125, the filter weight bit node wt is connected to the gates of transistors P2 and N2 whereas the complement filter weight bit node wtb is connected to the gates of transistors P1 and N1.

Referring again to FIG. 1A, transmission gate T1 is formed by a parallel combination of a PMOS transistor P3 and an NMOS transistor N3. The sources of transistors P3 and N3 connect to the filter weight bit node wt whereas their drains connect to the output node 105. Similarly, transmission gate T2 is formed by a parallel combination of a PMOS transistor P4 and an NMOS transistor N4. The sources of transistors P4 and N4 connect to the complement filter weight bit node wtb whereas their drains connect to the output node 105.

Figure 2:
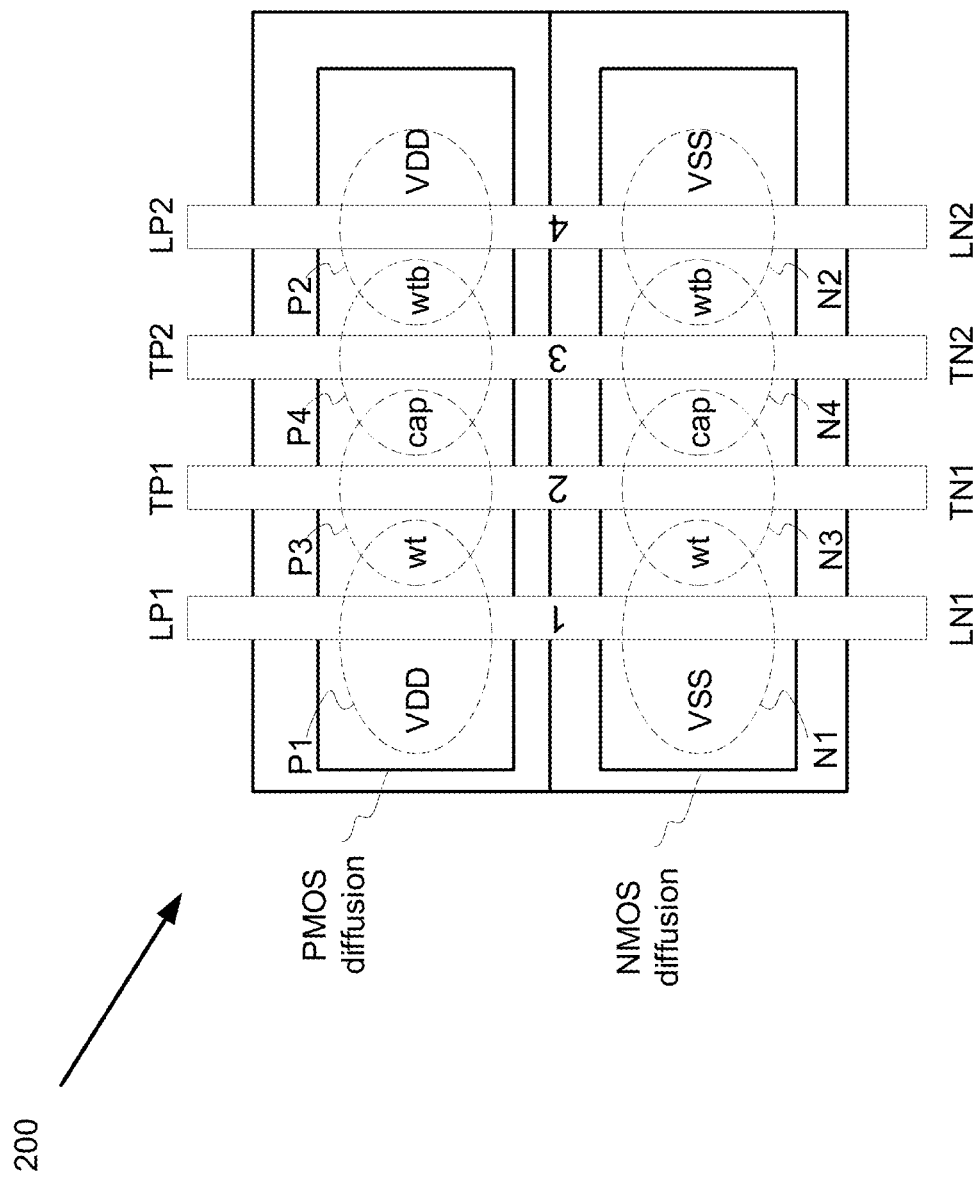
FIG. 2 illustrates a semiconductor layout for the transistors in the compute-in-memory bitcell of FIG. 1A.

The only switches connecting to the output node 105 are the first and second switches such as formed by the transmission gates T1 and T2. There is no read word line or reset switch transistor that connects between the output node 105 and ground. The absence of this reset switch transistor is quite advantageous with regard to the density for CiM bitcell 100. Note that a conventional static random access memory (SRAM) bitcell is formed using six transistor (6T). Such a conventional 6T bitcell may be formed on a semiconductor substrate using four polysilicon lines. By excluding the read word line switch transistor, bitcell 100 may also be implemented using four polysilicon (poly) lines. Bitcell 100 thus fits within a four-polysilicon-line pitch. An example layout for bitcell 100 will now be discussed in more detail. Transistors P1, N1, P2, N2, P3, N3, P4, and N4 may be laid out on a semiconductor substrate within a 4-poly pitch as shown in FIG. 2 to form a bitcell portion 200. The poly lines for these transistors are numbered from 1 through 4. The PMOS transistors are formed on a PMOS diffusion region whereas the NMOS transistors are formed on an NMOS diffusion region. The intersection of a poly line with the NMOS or PMOS diffusion regions forms a gate for a corresponding NMOS or PMOS transistor, respectively. Referring again to FIG. 1B, the gate for transistor P1 in inverter 120 may be designated as corresponding to a poly gate region LP1. Similarly, the gate for transistor N1 in inverter 120 is designated as corresponding to a poly gate region LN1. This same nomenclature is used in FIG. 2. A gate for transistor P1 in bitcell 100 is thus formed by a poly gate region LP1 in poly line 1. A VDD node in the PMOS diffusion region adjacent to the poly gate region LP1 forms the source for transistor P1 whereas a filter weight bit node wt in the PMOS diffusion region adjacent to the poly gate region LP1 forms the drain. In bitcell 100, the filter weight bit node wt is the output node for inverter 120. Transistor N1 for inverter 120 is analogous in that its gate is formed by a poly gate region LN1 in poly line 1. Note that a poly cut that is not shown isolates poly gate regions LP1 and LN1 in poly line 1. Similar poly cuts separate the remaining poly lines as well. The source of transistor N1 is formed by a VSS (ground) node in the NMOS diffusion region adjacent to poly line 1. Similarly, the drain of transistor N1 is formed by a filter weight bit node wt in the NMOS diffusion region on the other side of poly line 1.

Referring again to FIG. 1B, the gate for transistor P2 in inverter 125 may be labeled as corresponding to a poly gate region LP2. Similarly, the gate for transistor N2 in inverter 125 is labeled as corresponding to a poly gate region LN2. This same nomenclature is again used in FIG. 2. A gate for transistor P2 is thus formed by a poly gate region LP2 in the poly line 4 for bitcell 100. A VDD node in the PMOS diffusion region adjacent to this poly gate region LP2 forms the source for this transistor P2 whereas a complement filter weight bit node (wtb) in the PMOS diffusion region adjacent to the poly gate region LP2 forms the drain. Transistor N2 for inverter 125 is analogous in that its gate is formed by a poly gate region LN2 in poly line 4. A source for transistor N2 is formed by a VSS (ground) node in the NMOS diffusion region on one side of poly line 4 whereas a drain for transistor N2 is formed by a complement filter weight output node (wtb) in the NMOS diffusion region on the other side of poly line 4.

Referring again to FIG. 1A, a gate node for transistor P3 in transmission gate T1 may be denoted as TP1. Similarly, a gate node for transistor N3 in transmission gate T1 may be denoted as TN1. Poly line 2 for bitcell 100 in FIG. 3 thus forms a corresponding poly gate region TP1 for transistor P3 and forms a corresponding poly gate region TN1 for transistor N3. As seen in FIG. 1A, a gate node for transistor P4 in transmission gate T2 may be denoted as TP2 whereas a gate node for each transistor N4 in transmission gate T2 may be denoted as TN2. Poly line 3 for bitcell 100 in FIG. 2 thus forms a corresponding poly gate region TP2 for transistor P4 and forms a corresponding poly gate region TN2 for transistor N4.

CiM bitcell 100 operates in at least three phases or modes. To begin, a controller or write driver writes the filter weight bit into CiM bitcell 100 during a write operation. After the write operation, the capacitor is pre-charged in a pre-charge phase that may also be denoted as a reset phase. With the capacitor pre-charged, an evaluation phase may occur in which the input bit controls the first and second switches. Depending upon the state of the filter weight bit and the input bit, the first and second switches in combination with the capacitor then perform as a logic gate during the evaluation phase to adjust a voltage of the read bit line responsive to an effective binary multiplication of the input bit and the filter weight bit. The following discussion will be directed to the implementation of the write operation.

To perform a write operation in a conventional 6-T SRAM bitcell, a pair of access transistors are switched on to couple its cross-coupled inverters to a pair of bit lines. The two access transistors plus the four transistors from the cross-coupled inverters are the six transistors that complete a conventional SRAM bitcell. It takes two poly lines for the cross-coupled inverters and two additional poly lines for the pair of access transistors so that a conventional SRAM bitcell also fits within a four-poly pitch. But there is no equivalent of the access transistors in CiM bitcell 100 (nor is there an equivalent of the associated pair of bit lines). In lieu of using access transistors, it was known to ground the output node through the closing of a reset transistor that coupled between the output node and ground. This logical zero on the output node could then be written into the bitcell through the closing of a corresponding one of the first switch or the second switch. But CiM bitcell 100 lacks such a reset switch transistor. A write operation is disclosed herein that needs no access transistors (and their bit lines) nor does it require a reset switch transistor. This is quite advantageous in increasing density (the number of bitcells within a given area of semiconductor die area space). There are two main implementations of the write operation. The following discussion will first address a capacitively-coupled write operation followed by a discussion of a non-capacitively-coupled write operation.

Capacitively-Coupled Write Operation

Figure 3:
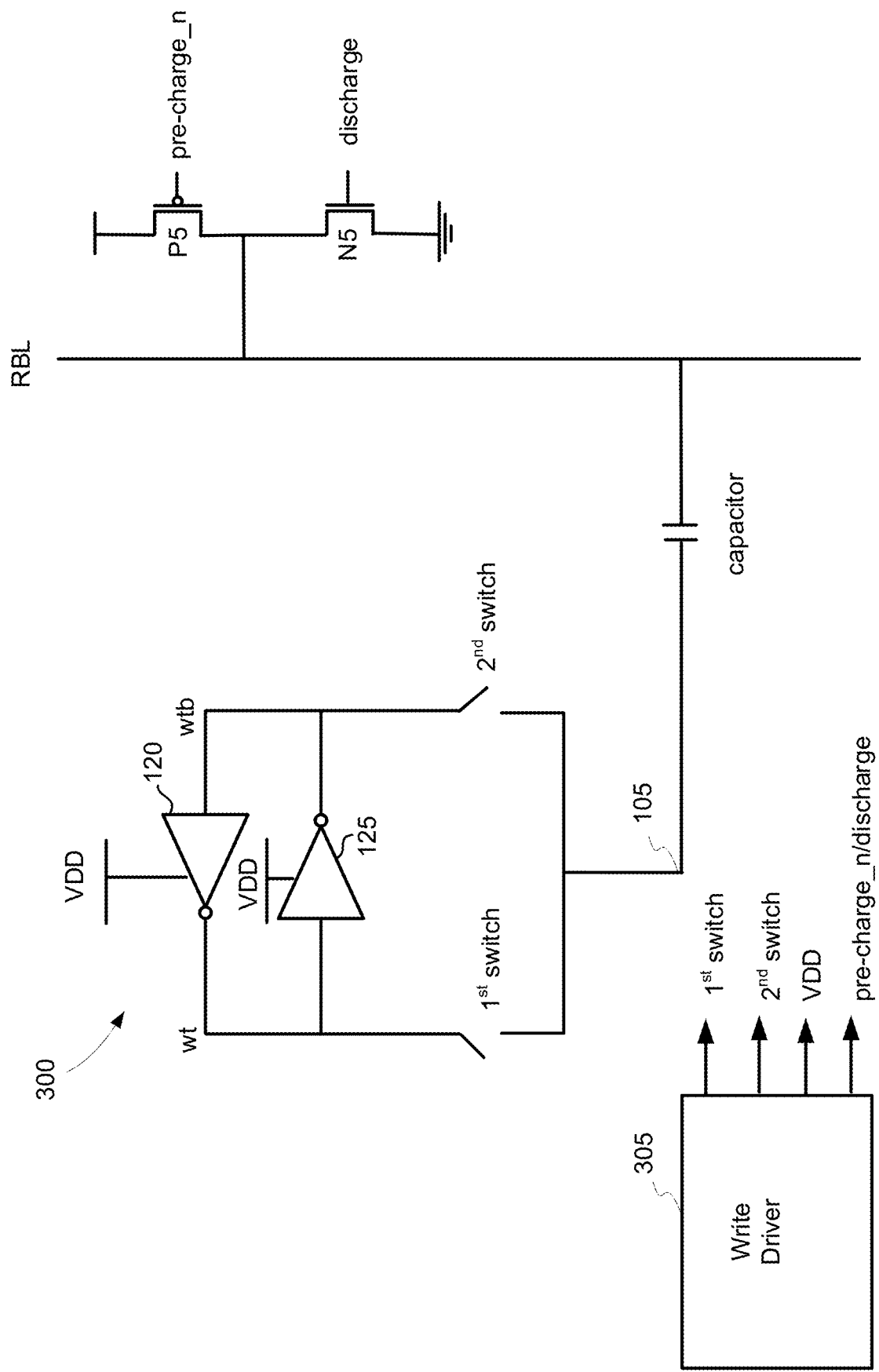
FIG. 3 is a circuit diagram of a compute-in-memory bitcell including a pair of switches and a corresponding write driver in accordance with an aspect of the disclosure.

A capacitively-coupled write operation will be discussed with reference to a CiM bitcell in which the first and second switches are shown in generic form. These switches may be implemented using the transmission gates T1 and T2 as discussed for CiM bitcell 100 or through individual switch transistors (either PMOS or NMOS). A generic CiM bitcell 300 and a corresponding write driver (or controller) 305 are shown in FIG. 3. The capacitive-coupled write operation may be performed in several different ways. In a first technique, write driver 305 decreases the power supply voltage VDD such as to approximately the threshold voltage Vth for transistors N1 and N2 in inverters 120 and 125, respectively, while the first switch and the second switch are both open. Prior to this power supply voltage decrease, filter weight bit node wt is either charged to the power supply voltage VDD or is discharged to ground depending upon the bitcell's previously-stored binary value. The complement filter weight bit node wtb has the complementary voltage such that it is either discharged (the filter weight bit node wt being charged) or charged to the power supply voltage VDD (the filter weight bit node wt being discharged). The node that was charged to the power supply voltage VDD will be referred to as the high node whereas the node that was discharged to ground will be referred to as the low node in the following discussion. The decrease in the power supply voltage VDD causes the high node to discharge approximately to the threshold voltage. The low node stays discharged at this time.

Note that that decrease in the power switch voltage VDD is applied only to inverters 120 and 125. For example, the power supply voltage (not illustrated) to the write driver 305 is not affected by this decrease. Prior to the sagging of the power supply voltage VDD, the read bit line RBL was charged to a power supply voltage (or to a common mode voltage) by the switching on of a PMOS transistor P5 that couples between the read bit line RBL and the corresponding voltage supply node. For example, controller 305 may discharge an active-low pre-charge signal (pre-charge_n) to charge the read bit line.

After the decrease in the power supply voltage VDD, write driver 305 then closes both the first switch and the second switch. Both the filter weight bit node wt and the complement filter weight bit node (as well as the output node 105) will thus be charged to approximately one-half of the threshold voltage Vth regardless of whether the previously-stored binary value was a binary one or a binary zero. With the first and second switches closed, write driver 305 may then discharge the read bit line RBL such as by switching off transistor P5 and switching on an NMOS transistor N5 that couples between ground and the read bit line RBL. For example, write driver 305 may assert an active-high discharge signal that drives a gate of transistor N5 to discharge the read bit line RBL while also charging the pre-charge_n signal to switch off transistor P5. This discharge of the read bit line capacitively couples through the capacitor to discharge the output node 105, the filter weight bit node wt, and the complement filter weight bit node wtb to approximately zero volts.

With output node 105 discharged, this "binary zero" may then be written into the appropriate filter weight bit node to write the desired binary value for the filter weight bit into CiM bitcell 300 by a corresponding complementary switching state for the first and second switches. For example, suppose that write driver 305 is writing a binary high value into CiM bitcell 300. In that case, write driver 305 applies the binary zero to the complementary filter weight bit node wtb by keeping the second switch closed and opening the first switch while the power supply voltage VDD is restored to its default value. In bitcell 100, write driver would thus close the second transmission gate and open the first transmission gate while the power supply voltage VDD is restored to write the same binary value. Conversely, if write driver 305 instead opens the second switch and keeps the first switch closed while the power supply voltage VDD is restored to its default value, a binary one value for the filter weight bit is being written into CiM bitcell 300. With the filter write bit being written to bitcell 300, driver 305 may then restore the read bit line back to its default state of being charged to the power supply voltage (or a common-mode voltage).

In an alternative capacitively-coupled write operation, write driver 305 may instead discharge the power supply voltage VDD completely, discharge the read bit line RBL, and close the first switch and the second switch instead of just partially discharging the power supply voltage VDD. The output node 105 voltage is thus discharged to approximately Vth/2 as discussed previously. Depending upon the binary value to be written, write driver 305 then configures the first and second switches into a complementary switching state and restores the read bit line RBL back to the power supply voltage VDD. This boosting of the read bit line voltage capacitively couples through the capacitor to boost the voltage of the output node 105 to, for example, approximately one-fourth of the power supply voltage VDD. This positive boosting of the output node 105 voltage couples through the closed one of the switches to boost the voltage of the corresponding filter weight bit node. For example, if the first switch is closed and the second switch is opened in the complementary switching state, the filter weight bit node wt will be charged to approximately one-fourth of the power supply voltage VDD. This boosting of the voltage of the filter weight bit node wt causes transistor N2 in inverter 125 to slightly turn on to discharge the voltage of the complement filter weight bit node wtb. Write driver 305 may then restore the power supply voltage VDD to inverters 120 and 125 to complete the writing of a binary one value into CiM bitcell 300. If instead the second switch was closed and the first switch opened, a binary zero value would be written into CiM bitcell 300. With the filter weight bit written into CiM bitcell 300, write driver 305 may then restore the read bit line voltage back to its default value.

The preceding capacitively-coupled write operations each involved a discharge of the read bit line RBL. Because the read bit line RBL extends across a plurality of CiM bitcells (e.g., a column of bitcells), the capacitance of the read bit line RBL may be significant such that the discharge of the read bit line voltage and its restoration consumes an appreciable amount of power. To avoid this power consumption, an "anchor" write operation may instead be performed that does not use a capacitively coupling from the read bit line RBL such that the read bit line RBL voltage is maintained at its default value. The anchor write operation will now be discussed in more detail.

Anchor Write Operation

In an anchor write operation, write driver 305 maintains the read bit line voltage at its default value and begins by discharging the power supply voltage VDD to ground while the first and second switches are closed. The output node 105 voltage will thus drop to approximately one-half of the threshold voltage Vth. Write driver 305 then configures the switches into a complementary switching state depending upon the binary value of the filter weight bit. If the binary value is a binary one, the first switch is closed while the second switch is opened. In that case, the residual charge on the output node 105 causes transistor N2 in inverter 125 to weakly turn on to ground the complement filter weight bit node wtb. Write driver 305 then restores the power supply voltage VDD so that the filter weight bit node wt is charged to the power supply voltage VDD to complete the writing of the binary one value. Conversely, if the binary value is a binary zero, the second switch is closed while the first switch is opened prior to the restoration of the power supply voltage VDD. Although an anchor write operation preserves the charge on the read bit line, the write margin may not be as robust as occurs for a capacitively-coupled write operation. Some example organizations or arrays of CiM bitcells as disclosed herein will now be discussed.

Some Example CiM Bitcell Arrays

Figure 4:
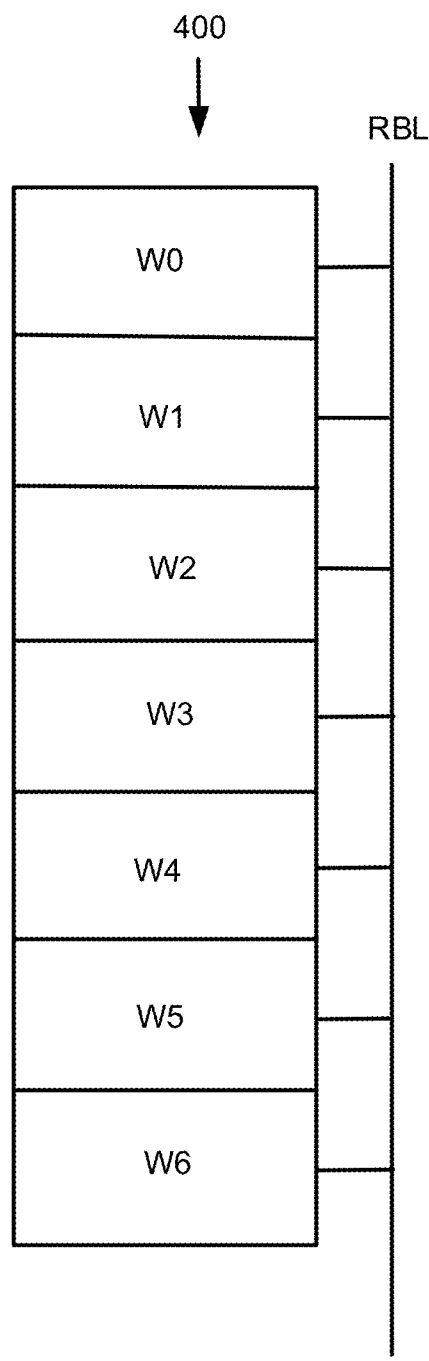
FIG. 4 illustrates a column of compute-in-memory bitcells organized to form a multiply-and-accumulate (MAC) circuit in accordance with an aspect of the disclosure.

CiM bitcells as disclosed herein may be organized to form a multiply-and-accumulate (MAC) circuit. An example MAC circuit 400 shown in FIG. 4 will now be discussed. MAC circuit 400 includes a plurality of CiM bitcells arranged such as discussed for CiM bitcells 100 or 300. In general, the number of bitcells included in MAC circuit 400 will depend upon the filter size. For illustration clarity, MAC circuit 400 is shown in including just seven CiM bitcells ranging from a zeroth bitcell storing a zeroth filter weight bit W0 to a sixth bitcell storing a six-filter weight bit W6. Each bitcell operates as discussed with regard to bitcell 100 or 300 during the write operation as controlled by a write driver (not illustrated).

Figure 5:
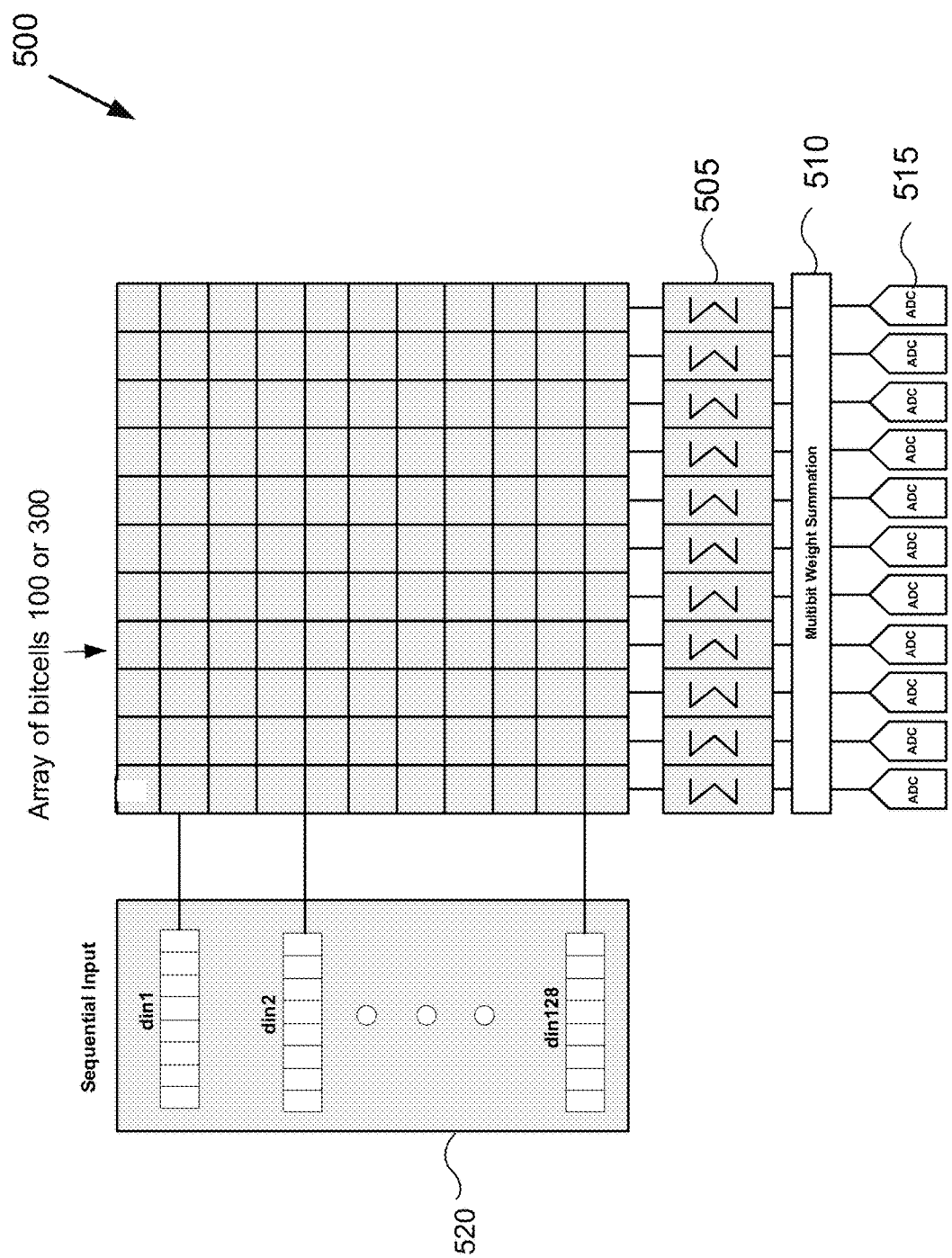
FIG. 5 illustrates an array of compute-in-memory bitcells organized to form an array of a plurality of MAC circuits in accordance with an aspect of the disclosure.

A plurality of MAC circuits may be arranged to form a memory array 500 as shown in FIG. 5. Each column of bitcells 100 or 300 forms a corresponding MAC circuit. For example, the filter size is 128 in array 500 so that each column in array 500 has 128 bitcells 100 or 300. An input vector 520 will thus have 128 input bits (which may also be denoted as activation bits), ranging from a first activation bit din1 to a 128th activation bit din128. After a write operation to write the filter weight bits to memory array 500, input vector 520 sequentially changes so that each MAC circuit performs a reset phase in which the capacitors in the CiM bitcells are pre-charged followed by a calculation phase in which the activation bits are multiplied by the corresponding filter weight bits. The calculation phase may be followed by an accumulation phase for each sample of input vector 520. Note that each input sample such as din1 may be a multi-bit input sample. For example, din1 may be a three-bit wide sample din1. Since each CiM bitcell performs a binary multiplication, the various bits in the multi-bit input samples are sequentially processed by each MAC circuit in array 500. A sequential integrator 505 for each MAC circuit thus functions to weight the accumulation results according to the weight of the multi-bit input samples. For example, suppose each sample of input vector 520 is a three-bit-wide sample ranging from a least-significant bit (LSB) sample to a most-significant bit (MSB) sample. Each sequential integrator 505 thus sums the accumulation results according to their bit weight. In addition, the filter weights themselves may be multi-bit filter weights. Since each differential bitcell stores a binary filter weight, one MAC circuit may be used for one filter weight bit (e.g., the LSB weight), a neighboring MAC circuit may be used for the next-most-significant filter weight bit, and so on. In such an embodiment three adjacent MAC circuit would be used for a three-bit-wide filter weight embodiment. A multi-bit weight summation circuit 510 accumulates the corresponding MAC accumulation values (as processed through the corresponding sequential integrators 505 as necessary in the case of multi-bit input samples) and sums the MAC accumulation values according to the binary weights of the filter weight bits. Finally, an analog-to-digital converter (ADC) 515 digitizes the final accumulation result. This digitization is greatly simplified, however, due to the differential read bit line voltages for each MAC circuit that inherently cancels the neuron bias.

Figure 6:
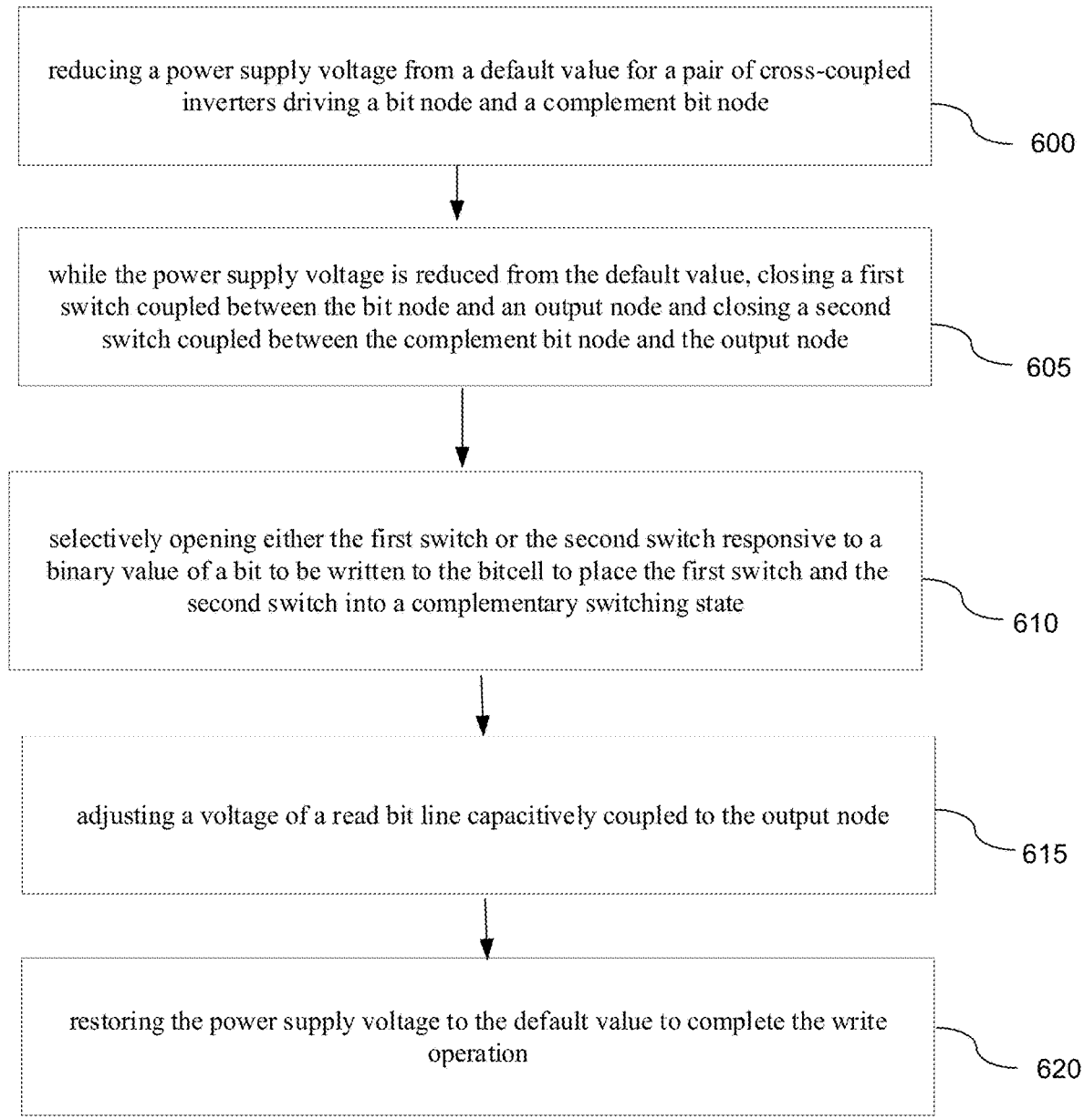
FIG. 6 is a flowchart for an example capacitively-coupled method of writing to a compute-in-memory bitcell in accordance with an aspect of the disclosure.

An example capacitively-coupled write method to a CiM bitcell will now be discussed with reference to the flowchart of FIG. 6. The method includes an act 600 of reducing a power supply voltage from a default value for a pair of cross-coupled inverters driving a bit node and a complement bit node. The reduction of the power supply voltage to either the threshold voltage or to ground is an example of act 600. The method also includes an act 605 that occurs while the power supply voltage is reduced and includes closing a first switch coupled between the bit node and an output node and closing a second switch coupled between the complement bit node and the output node. The closing of both the transmission gates in bitcell 100 or of both of the switches in bitcell 300 is an example of act 605. The method further includes an act 610 of selectively opening either the first switch or the second switch responsive to a binary value of a bit to be written to the bitcell to place the first switch and the second switch into a complementary switching state. The selective opening of either switch during a capacitively-coupled write operation is an example of act 610. In addition, the method includes an act 615 of adjusting a voltage of a read bit line capacitively coupled to the output node. The discharge of the read bit line voltage to ground (or a charge of the read bit line voltage to a power supply voltage level) is an example of act 615. Finally, the method includes an act 620 of restoring the power supply voltage to the default value to complete the write operation as discussed previously.

Figure 7:
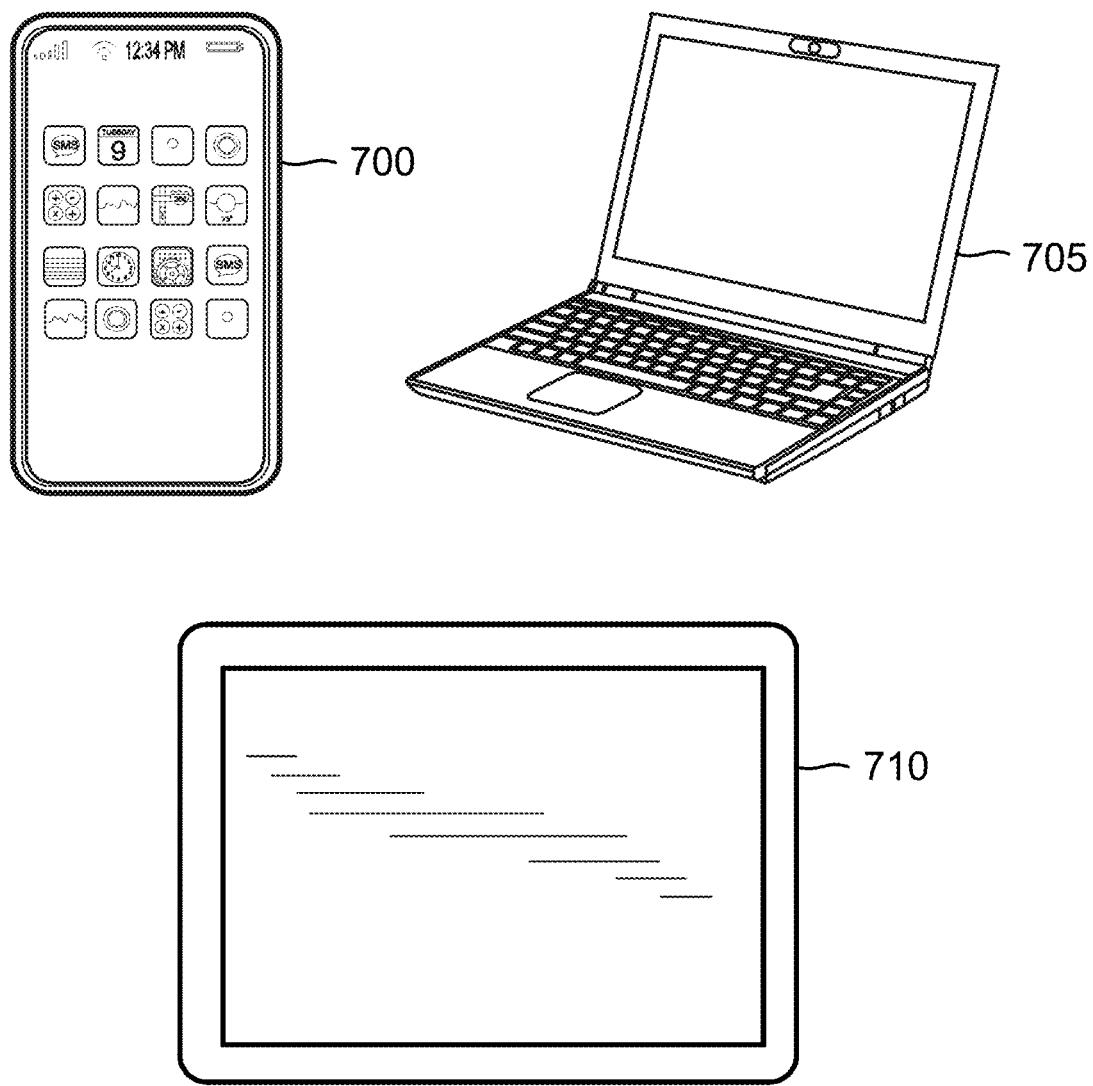
FIG. 7 illustrates some example electronic systems each incorporating an array of compute-in-memory bitcells in accordance with an aspect of the disclosure.

A compute-in-memory bitcell as disclosed herein may be advantageously incorporated in any suitable mobile device or electronic system. For example, as shown in FIG. 7, a cellular telephone 700, a laptop computer 705, and a tablet PC 710 may all include a compute-in-memory having compute-in-memory bitcells such as for machine learning applications in accordance with the disclosure. Other exemplary electronic systems such as a music player, a video player, a communication device, and a personal computer may also be configured with compute-in-memories constructed in accordance with the disclosure.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A bitcell, comprising:
a write driver;
a pair of cross-coupled inverters having a bit node and a complement bit node;
an output node;
a read bit line;
a capacitor coupled between the read bit line and the output node;
a first switch coupled between the bit node and the output node, the first switch being configured to switch on and off responsive to the write driver; and
a second switch coupled between the complement bit node and the output node, the second switch being configured to switch on and off responsive to the write driver, and wherein the first switch and the second switch are the only switches coupled to the output node.

2. The bitcell of claim 1, wherein the first switch comprises a first transmission gate and the second switch comprises a second transmission gate.

3. The bitcell of claim 1, wherein the first switch comprises a first switch transistor and the second switch comprises a second switch transistor.

4. The bitcell of claim 1, wherein the write driver is configured to switch the first switch and the second switch into a complementary switching state.

5. The bitcell of claim 4, wherein the write driver is further configured to discharge a voltage of the read bit line during the write operation to reduce a voltage of the output node during the write operation.

6. The bitcell of claim 5, wherein the write driver is further configured to discharge a power supply voltage for the cross-coupled inverters during the write operation.

7. The bitcell of claim 4, wherein the write driver is further configured to charge a voltage of the read bit line from ground to a power supply voltage to increase a voltage of the output node during the write operation.

8. The bitcell of claim 7, wherein the write driver is further configured to discharge a power supply voltage for the cross-coupled inverters during the write operation.

9. The bitcell of claim 1, wherein the bitcell is included in a column of additional bitcells to form a multiply-and-accumulate MAC circuit.

10. The bitcell of claim 9, wherein the MAC circuit is included with an array of additional MAC circuits.

11. The bitcell of claim 1, wherein the bitcell is integrated within a cellular telephone.

12. The bitcell of claim 1, wherein the bitcell is integrated within a four polysilicon line pitch on a semiconductor die.

13. A method for a write operation to a bitcell, comprising:
reducing a power supply voltage from a default value for a pair of cross-coupled inverters driving a bit node and a complement bit node;
while the power supply voltage is reduced from the default value, closing a first switch coupled between the bit node and an output node and closing a second switch coupled between the complement bit node and the output node;
selectively opening either the first switch or the second switch responsive to a binary value of a bit for the write operation to place the first switch and the second switch into a complementary switching state;
adjusting a voltage of a read bit line capacitively coupled to the output node; and
restoring the power supply voltage to the default value to complete the write operation.

14. The method of claim 13, wherein the reducing of the power supply voltage comprises discharging the power supply voltage to ground.

15. The method of claim 13, wherein the adjusting of the voltage of the read bit line comprises charging the voltage of the read bit line from ground to a power supply voltage level during the complementary switching state.

16. The method of claim 13, wherein the reducing of the power supply voltage comprises discharging the power supply voltage from the default value to approximately equal a transistor threshold voltage.

17. The method of claim 16, wherein the adjusting of the voltage of the read bit line comprises discharging the voltage of the read bit line to ground prior to the complementary switching state.

18. The method of claim 17, wherein the selectively opening either the first switch or the second switch comprises opening the first switch responsive to the binary value being a binary one value.

19. The method of claim 17, wherein the selectively opening either the first switch or the second switch comprises opening the second switch responsive to the binary value being a binary zero value.

20. A method for a write operation to a bitcell, comprising:
discharging a power supply voltage to ground from a default value for a pair of cross-coupled inverters driving a bit node and a complement bit node;
while the power supply voltage is reduced, closing a first switch coupled between the bit node and an output node and closing a second switch coupled between the complement bit node and the output node;
selectively opening either the first switch or the second switch responsive to a binary value of a bit to be written to the bitcell to place the first switch and the second switch into a complementary switching state; and
during the complementary switching state, restoring the power supply voltage to the default value to complete the write operation.

21. The method of claim 20, wherein selectively opening the first switch or the second switch comprises opening the first switch responsive to the binary value of the bit being a binary one value.

22. The method of claim 20, wherein selectively opening the first switch or the second switch comprises opening the second switch responsive to the binary value of the bit being a binary zero value.

23. The method of claim 20, further comprising:
maintaining a voltage of a read bit line capacitively coupled to the output node at a default value during the write operation.

24. The method of claim 20, wherein selectively opening the first switch or the second switch comprises selectively opening either a first transmission gate or a second transmission gate.

25. A memory, comprising:
a pair of cross-coupled inverters having a bit node and a complement bit node;
an output node;
a read bit line;
a capacitor coupled between the read bit line and the output node;
a first switch coupled between the bit node and the output node;
a second switch coupled between the complement bit node and the output node; and
a write driver configured to adjust a voltage of the read bit line to capacitively couple a voltage from the read bit line to a node selected from the bit node and the complement bit node responsive to a binary value to be written to the cross-coupled inverters.

26. The memory of claim 25, wherein the first switch comprises a first transmission gate and the second switch comprises a second transmission gate.

27. The memory of claim 25, wherein the first switch comprises a first switch transistor and the second switch comprises a second switch transistor.

28. The memory of claim 25, wherein the write driver is further configured to discharge a power supply voltage to ground for the cross-coupled inverters during the write operation.

29. The memory of claim 25, wherein the write driver is further configured to partially discharge a power supply voltage to ground for the cross-coupled inverters during the write operation.

* * * * *